(12) United States Patent
Kitayama et al.

(10) Patent No.: US 6,360,762 B2
(45) Date of Patent: Mar. 26, 2002

(54) METHOD FOR FEEDING GASES FOR USE IN SEMICONDUCTOR MANUFACTURING

(75) Inventors: Hirofumi Kitayama, Kanagawa-ken (JP); Yoichi Kurono, Beverly, MA (US); Nobukazu Ikeda; Naoya Masuda, both of Osaka (JP)

(73) Assignees: Fujikin Incorporated, Osaka; Tokyo Electron Ltd., Tokyo, both of (JP)

( * ) Notice: Subject to any disclaimer, the term of this patent is extended or adjusted under 35 U.S.C. 154(b) by 0 days.

(21) Appl. No.: 09/765,665

(22) Filed: Jan. 22, 2001

Related U.S. Application Data (62) Division of application No. 09/296,136, filed on Apr. 22, 1999, now Pat. No. 6,210,482.

(51) Int. Cl.⁷ .............................................. F16K 31/02
(52) U.S. Cl. ...................... 137/1; 137/607; 137/624.11; 137/599.07
(58) Field of Search ........................ 137/624.11, 599.07, 137/607, 1

(56) References Cited

U.S. PATENT DOCUMENTS

| | | | | |
|---|---|---|---|---|
| 4,369,031 A | * | 1/1983 | Goldman et al. | 432/198 |
| 5,709,757 A | * | 1/1998 | Hatano et al. | 134/22.14 |
| 6,062,256 A | * | 5/2000 | Miller et al. | 137/487.5 |
| 6,178,995 B1 | * | 1/2001 | Ohmi et al. | 137/486 |
| 6,210,482 B1 | * | 4/2001 | Kitayama et al. | 118/715 X |

\* cited by examiner

*Primary Examiner*—Kevin Lee
(74) *Attorney, Agent, or Firm*—Griffin & Szipl, P.C.

(57) ABSTRACT

An apparatus for feeding gases for use in semiconductor manufacturing reduced in size and manufacturing costs and facilitating maintenance and operation of the gas supply system. The apparatus comprises a plurality of gas supply sources, gas source valves provided on the gas lead-out pipes from the respective gas supply sources, flow rate controllers provided on main gas feed pipes into which the lead-out pipes converge, and gas supply valves provided on the outlet side of the flow rate controllers.

8 Claims, 9 Drawing Sheets

METHOD FOR FEEDING GASES FOR USE IN SEMICONDUCTOR MANUFACTURING

This application is a division of U.S. patent application Ser. No. 09/296,136, filed Apr. 22, 1999, now U.S. Pat. No. 6,210,482, the entire disclosure of which is incorporated herein by reference.

FIELD OF THE INVENTION

The present invention relates to improved apparatuses and methods for feeding gases. More specifically, in one embodiment this invention relates to feeding or supplying a plurality of different types of gases one after another through a single gas feed pipe by switching the gas type from one to another at specific time intervals. In another embodiment, this invention relates to feeding or supplying a single type of gas through one or a plurality of pipes or any combination of pipes in any sequence of switching pipes. With the flow rates controlled by means of a single flow rate controller in semiconductor manufacturing facilities, this offers such advantages as reduction in the size and manufacturing costs of the gas feeder.

BACKGROUND OF THE INVENTION

In semiconductor manufacturing, many types of gases are used in different ways. For example, a number of different types of gases are drawn, not all at once but one after another in a series fashion by switching the gas type from one to another at specific time intervals. Also, one and the same type of gas is often used at different flow rates simultaneously or in parallel. In those applications, the flow rates must be controlled with high accuracy.

In prior art gas feeding apparatuses for use in semiconductor manufacturing, flow rate controllers such as mass flow rate controllers are installed, one on each gas line, to control the flow rate with high accuracy.

In etching, one of the important processes in semiconductor manufacturing, for example, a plurality of insulating films are etched. This process is made up of a number of etching steps. In each step, 3 or 4 types of gases are used in combination. To supply those gases, prior art gas feeders require a total of more than 10 gas and flow rate controllers in the etching process alone. A vast number of such controllers have to be installed to serve an entire semiconductor manufacturing plant.

In the Chemical Vapor Deposition (CVD) process, a type of gas is supplied to a treatment reactor at one or different flow rates through a plurality of outlets simultaneously to carry out a CVD treatment. The prior art gas feeder has a flow rate controller installed at every outlet line to regulate the flow rates. Here, also, too many flow rate controllers are needed. To a single treatment reactor for the CVD process, in addition, a plurality of types of gases may also be supplied in a series fashion. That likewise requires quite a number of flow rate controllers.

Heretofore, mass flow rate controllers had been the primary flow rate controllers used. In recent years, so-called pressure-type flow control systems have become more common.

The installation of a large number of flow rate controllers not only increases the size of the gas feeder but also makes it difficult to keep down the costs both of the feeder itself and of facility maintenance and service costs. This also presents such problems as increased labor in maintenance and the necessity of keeping many replacement and spare parts in stock, which inevitably raises the running costs of the gas feeder.

The present invention addresses those problems encountered with the prior art apparatuses and methods for feeding gases in semiconductor manufacturing plants, that is, the necessity of installing too many flow rate controllers, one for each outlet line, which has prohibited size reduction of the gas feeding equipment and reduction of the costs of the equipment itself.

SUMMARY OF THE INVENTION

It is accordingly a primary object of the present invention to provide an apparatus and method for feeding gases for use in semiconductor manufacturing.

This novel apparatus and method, by means of only a few flow rate controller units, controls many different types of gases or different flow rates of the same gas in semiconductor manufacturing with high accuracy. Moreover, the novel apparatus and method permits a reduction in the size of the gas feeder itself and a substantial reduction in the manufacturing costs of the equipment.

The object of the invention is achieved by installing a single flow rate controller in a single process consisting of a number of steps or a group of common steps in the respective processes, thereby controlling the gas flow rates so as to supply one and the same type of gas or a plurality of different types of gases to each process or step one after another, by switching the gas flow path or gas type from one to another at specific time intervals, and also by making arrangements so that many different types of gases or significantly different flow rates of one and the same gas are dealt with or controlled with high accuracy and supplied through one or a plurality of feed ports.

In each semiconductor manufacturing process or in steps in the process, many different types of gases are used. They are generally used, however, not all at a time but one after another or in a series fashion. That is, the flow of gases to a process is switched from one type of gas to another type of gas at specific time intervals. Even a single flow rate controller can control different flow rates of one type of gas or the flow of a plurality of gases with high accuracy, if the flow characteristics can be automatically switched and compensated or switched and adjusted to cope with the change in gas type or flow rate.

The apparatus for feeding gases for use in semiconductor manufacturing as defined in one embodiment is basically constituted of a plurality of gas supply sources, gas source valves provided on the respective lead-out pipes, a flow rate controller provided on the main gas feed pipe into which the lead-out pipes converge, and a gas feed valve mounted on the outlet side of the flow rate controller. Preferredly, a plurality of units of this apparatus for feeding gas are arranged in parallel and each gas feeder supplies different types of gases as needed to the semiconductor manufacturing facilities.

The apparatus for feeding gases for use in semiconductor manufacturing in another embodiment is basically constituted of a unit of gas supply source, a flow rate controller installed on the main gas feed pipe from the gas supply source, and a plurality of gas feed valves provided on the outlet side of the flow rate controller in the shape of a plurality of parallel branches. Preferredly, a plurality of units of this apparatus too for feeding gas are arranged in parallel and each gas feeder supplies different types of gases as needed to the semiconductor manufacturing facilities.

In both of the above embodiments of the invention, the flow rate controller may be either a mass flow controller or a pressure-type controller.

When a pressure-type controller is used in this invention, the pressure-type flow control system may comprise a control valve CV provided on the main gas feed pipe, a pressure detector 14 provided on the downstream side from the control valve CV, a plurality of orifices 2a, 2b, . . . provided in parallel on the downstream side from the pressure detector 14, a flow rate calculation circuit 20 for calculating the flow rate Qc=KP1 (where K is a constant) from the pressure P1 detected at the pressure detector 14, a flow rate setting circuit 32 for outputting a flow rate setting signal Qs, and a calculation control circuit 38 for outputting the difference between the calculation flow rate signal Qc and the flow rate setting signal Qs as control signal Qy to the drive 8 of the control valve CV. The control valve CV is operated to bring the control signal Qy to zero, thereby controlling the flow rates on the downstream side from the orifices 2a, 2b . . . and at the same time selecting the orifice with the bore matching with the gas flow rate out of the plurality of orifice 2a, 2b . . . and actuating the same.

In the above-described apparatuses, the pressure-type flow control system may be configured so that one or a plurality of orifices are provided in the shape of branches and installed on the downstream side from the gas feed valve. In this case, a plurality of units of the orifice may be provided in the shape of branches at the inlet of or inside of the treatment reactor on the downstream side from the gas feed valve.

Still another embodiment of the present invention is a method for feeding gases for use in semiconductor manufacturing, which method comprises providing a single flow rate controller for gas supply in each semiconductor manufacturing process or in a group of common steps in the processes and wherein, with the flow rates regulated by the flow rate controller, one type or plurality of types of gases are switched and supplied one after another to each process or each common step group at specific time intervals. In carrying out this method, a single type or a plurality of types of gases may be supplied to a single treatment reactor from a plurality of feed ports. Further, in implementing this method, one may work out in advance the flow rate control characteristics of the mass flow controller in the form of data for each type of gas to be supplied and each flow rate, store those data in a storage of a control computer, retrieve the flow rate characteristics matching for the type of gas or flow rate to be switched over to from the computer storage when the gas type or flow rate is switched, and regulate the flow rate of gas according to the flow rate characteristics.

In accordance with the method of the present invention in which the flow rate controller is of the pressure-type, one may work out in advance the flow factor FF in relation to a reference gas (e.g., nitrogen gas) for each type of gas to be supplied and, when the gas type is switched, bring the flow rate specifying signal Qs after the switching to kQe, that is Qs=kQe in which Qe is the flow rate setting signal for the reference gas and k is the flow rate conversion rate.

When the flow rate controller herein is of the pressure-type, it may be provided with a plurality of orifices with different bores in parallel and those orifices may be selectively activated according to the flow rate of the gas to be switched over to.

DESCRIPTION OF THE PREFERRED EMBODIMENTS

Now, various illustrative embodiments of the present invention will be described with reference to the drawings.

EXAMPLE 1

Figure 1:
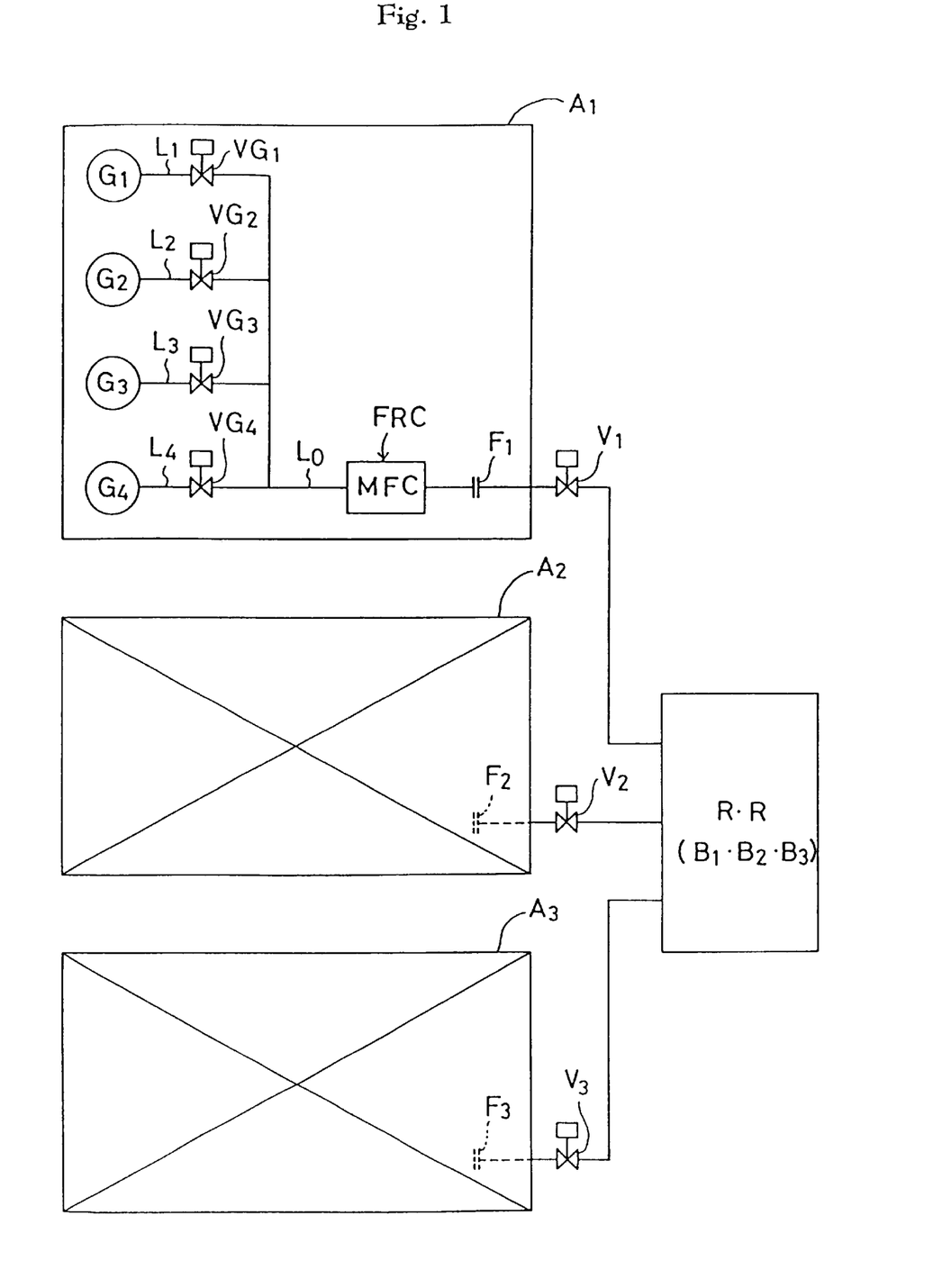
FIG. 1 is a schematic flow diagram of the configuration of an apparatus for feeding gases for use in semiconductor manufacturing of a first embodiment of the present invention, with part of the apparatus omitted.

FIG. 1 shows a first embodiment of the present invention. In FIG. 1, RR is a treatment reactor forming part of semiconductor manufacturing facilities and A1, A2, A3 are individual apparatuses for feeding gases to the treatment reactor RR. That is, the gas feeders A1, A2, and A3 supply the gases needed for treatment steps B1, B2, and B3 to be carried out in the treatment reactor RR. For example, when the treatment step B1 is to be carried out in the treatment reactor RR, the gas feed valve V1 will be opened while the feed valves V2 and V3 will be closed. Then gases G1, G2, G3, and G4 are switched and supplied one after another to the treatment reactor RR at specific time intervals.

In FIG. 1, G1, G2, G3, and G4 are different supply gas sources, each for a different type gas: G1 for oxygen, G2 for hydrogen, G3 for nitrogen, and G4 for $SiH_4$, for example.

MFC is a mass flow controller forming a flow rate controller FRC. VG1, VG2, VG3, and VG4 are gas source valves. L1, L2, L3, and L4 are gas lead-out pipes. Lo is a main gas feed pipe. F1, F2, and F3 are gas take-off ports. And V1, V2, and V3 are gas feed valves.

The mass flow controller MFC making up the flow rate controller FRC itself is already known and no detail will be described. But it is noted that the mass flow controller MFR used in the present invention has lots of prepared flow rate control characteristic curves on every type of gas and every gas flow rate stored in the storage of a control computer attached thereto. When the type of gas or the flow rate is switched from one to another, the flow rate control is automatically retrieved from the storage in the computer (not shown). On the basis of the retrieved flow rate control characteristics, the flow rate of the gas to be switched over to is controlled with adjustment made to such functions as linear riser in the mass flow controller MFC.

In the embodiment shown in FIG. 1, when the gas type or the flow rate of gas is switched, the linear riser in the mass flow controller MFC is so adjusted as to conform the flow rate characteristics of the mass flow controller MFC to the flow rate characteristics prepared in advance on every gas type. But another procedure is also possible. It is this: The flow rate control characteristic curves in the mass flow controller MFC are fixed on only the gas types and the flow rates conforming to the standard. For the gas types or flow rates outside the standard, their conversion factors against the standard gases are worked out and stored in advance so that when the gas type or the flow rate is changed, an approximate control parameter corresponding to the standard gas and the standard flow rate is calculated on the basis of the measurements at that time and the conversion factors. According to that approximate control parameter, the flow rate of the non-standard gas is controlled.

In FIG. 1, three gas feeders A1, A2, and A3 are combined in parallel to constitute a gas supply battery. In practice, a gas supply battery is generally formed of three to ten gas feeders.

EXAMPLE 2

Figure 2:
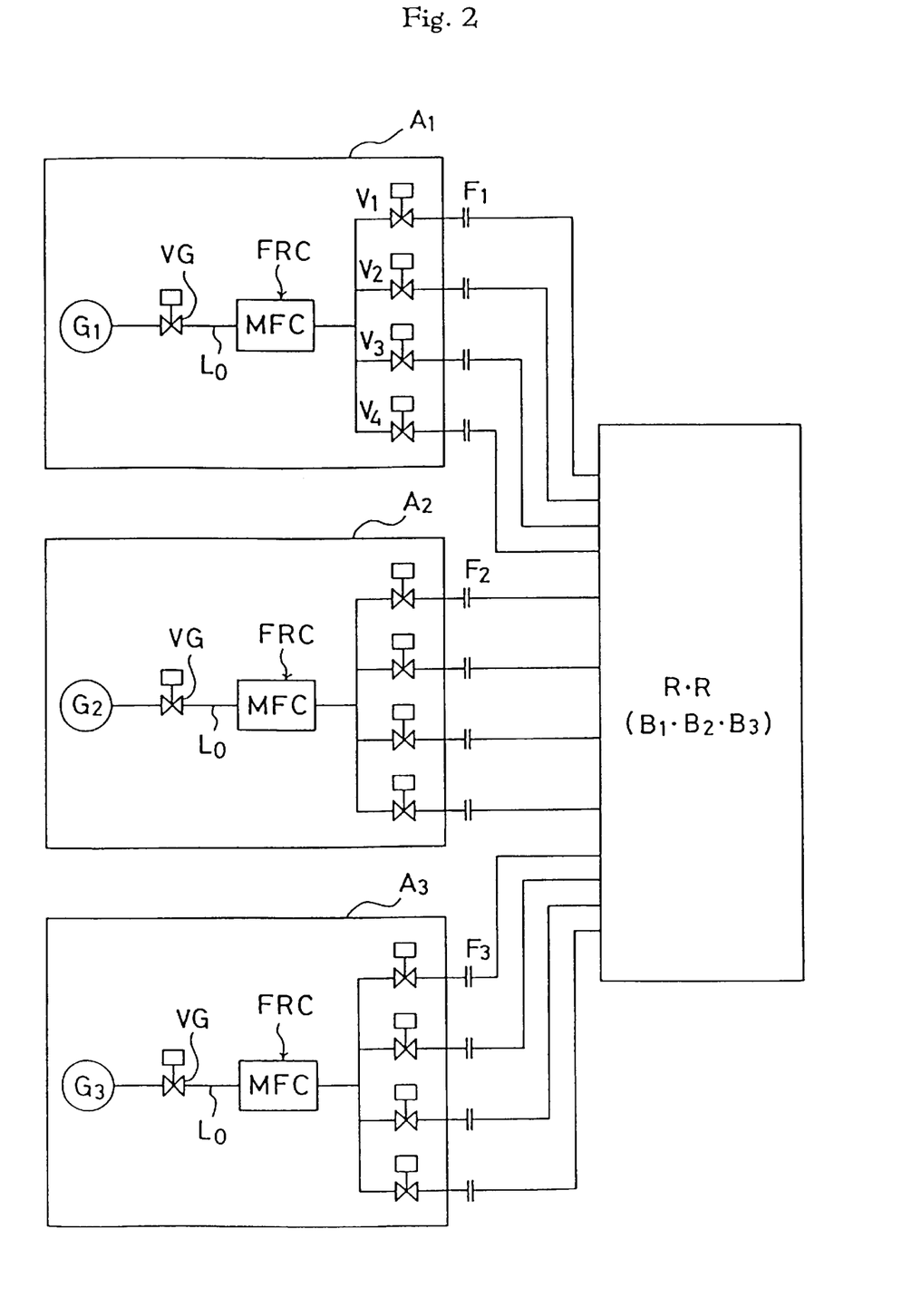
FIG. 2 is a schematic flow diagram of the configuration of an apparatus for feeding gases for use in semiconductor manufacturing of a second embodiment of the present invention, with part of the apparatus omitted.

FIG. 2 shows a second embodiment of the present invention. It is so configured that one gas supply source G1 supplies one and the same type of gas at specific rates simultaneously to a plurality of gas feed ports provided on the treatment reactor RR through a flow rate controller FRC, a main gas feed pipe Lo and a plurality of gas feed valves V1 to V4 on branch pipes. The feed path may be switched from a specific port or ports to another at specific time intervals, too.

In FIG. 2, three gas feeders A1, A2, and A3 are installed in parallel. In practice, five to ten feeders are arranged in parallel to form a battery of gas feeders as in FIG. 1.

EXAMPLE 3

Figure 3:
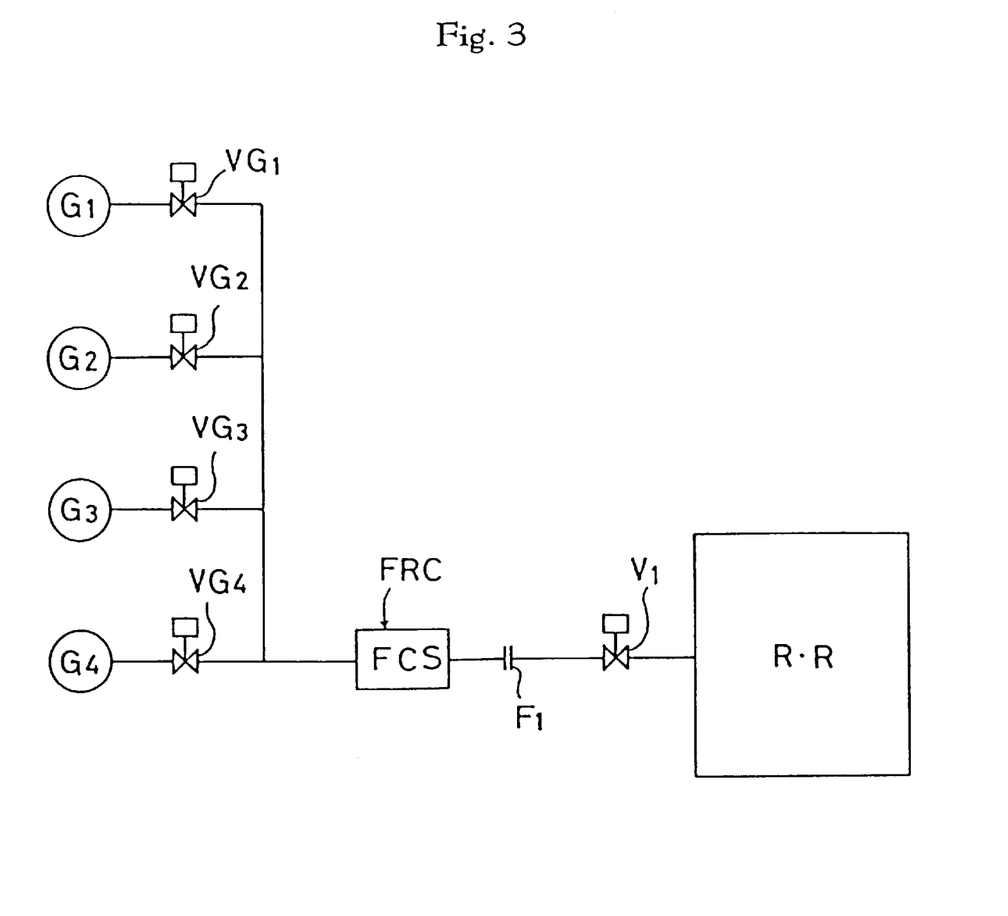
FIG. 3 is a schematic flow diagram of the configuration of an apparatus for feeding gases for use in semiconductor manufacturing of a third embodiment of the present invention, with part of the apparatus omitted.

FIG. 3 shows a third embodiment of the present invention. In this embodiment, a pressure-type flow control system FCS is used as flow rate controller FRC instead of the mass flow controller MFC used in FIG. 1.

The gas feeder A in FIG. 3 is exactly the same as that in FIG. 1 except that the flow rate controller FRC installed is a pressure-type flow control system FCS, and not the mass flow controller MFC, and so there will be no detailed description of the gas feeder.

Figure 4:
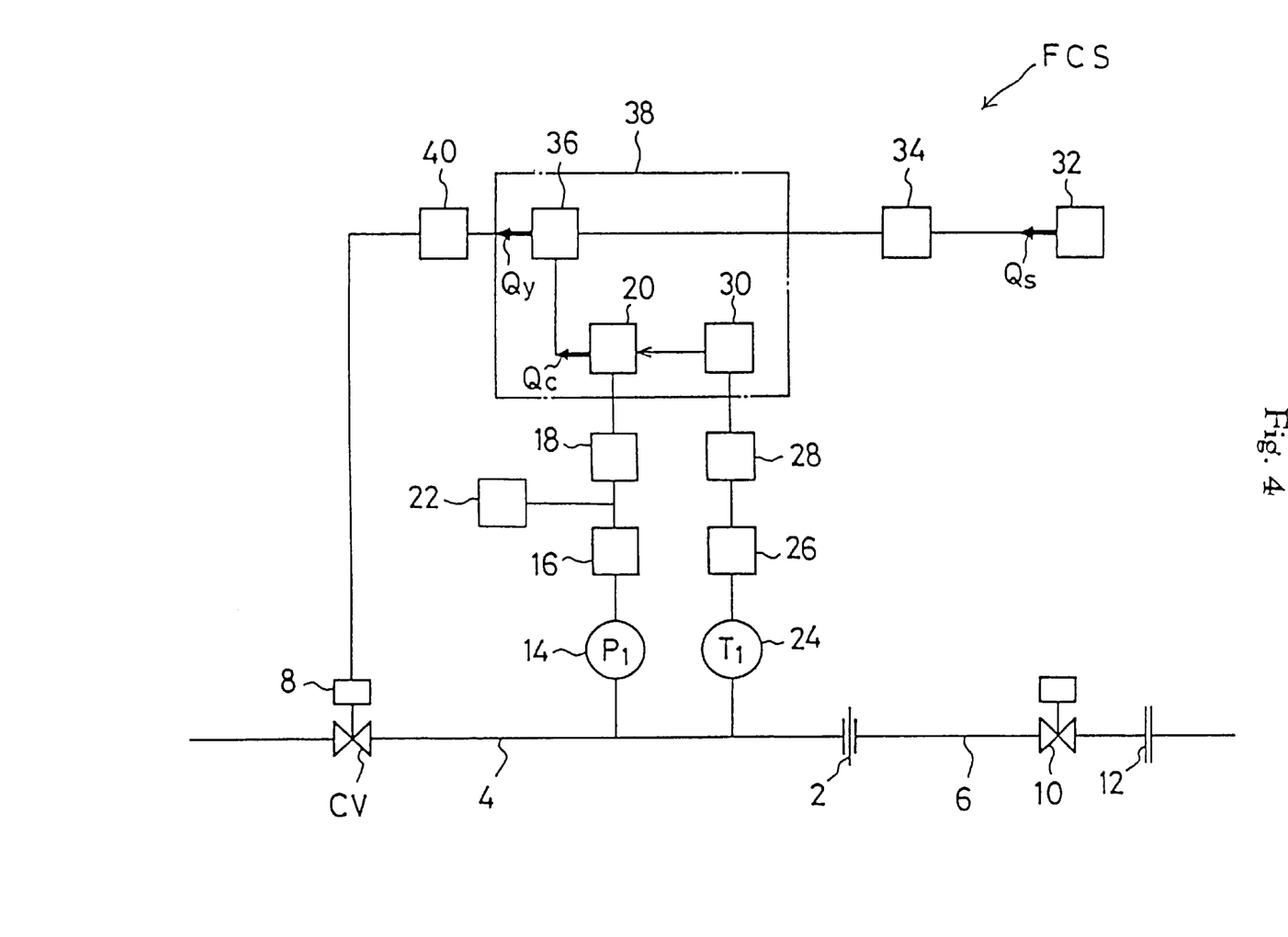
FIG. 4 is a schematic flow diagram of the basic configuration of the pressure-type flow control system used in the present invention.

FIG. 4 is a schematic flow diagram of the configuration of the pressure-type flow control system FCS which is used in the gas feeders shown in FIG. 3.

In FIG. 4, if the ratio between the gas pressures before and after an orifice 2, that is, the ratio of the downstream gas pressure P2 to the upstream gas pressure P1, falls below the critical gas pressure ratio (in the case of air, nitrogen, etc., about 0.5), the flow velocity of the gas passing the orifice will reach sonic velocity. As a result, the fluctuation in pressure on the downstream side of the orifice 2 will be difficult to convey to the upstream side, and that will bring about a stable mass flow rate on the downstream side matching with the state on the upstream side of the orifice 2.

That is, if, with a fixed bore of the orifice 2, the upstream pressure P1 is set at about twice or more than twice the downstream pressure P2, the downstream flow rate Qc of the gas passing the orifice 2 will depend on only the upstream pressure P1 and the linear relationship Qc=KP1 will hold good to the highest degree. If the bore of the orifice is fixed, the constant K will be fixed.

The flow path 4 on the upstream side of the orifice 2 is connected to a control valve CV which is operated by a drive 8, while the flow path 6 on the downstream side is connected to the treatment reactor (not shown) via an orifice-responding valve 10 and a gas take-off joint 12.

The pressure P1 on the upstream side of the orifice 2 is detected by the pressure detector 14, and amplified by an amplification circuit 16 and displayed on a pressure display 22. The output is passed on to an analog-digital (A-D) converter to be digitalized, from which the flow rate Q on the downstream side of orifice, that is, Q–KP1 (K:constant) is calculated by a calculation circuit 20.

On the other hand, the temperature T1 on the upstream side is detected by a temperature detector 24 and output through an amplification circuit 26 and an A-D converter 28 to a temperature compensation circuit 30, where the flow rate Q is temperature-compensated. The calculated flow rate Qc is output to a comparison circuit 36. Here, the calculation circuit 20, the temperature compensation circuit 30 and the comparison circuit 36 make up a calculation control circuit 38.

A flow rate setting circuit 32 outputs a flow rate Qs through an A-D converter 34 to the comparison circuit 36. The comparison circuit 36 calculates a difference signal Qy between the calculated flow rate Qc and the set flow rate Qs, that is, Qy=Qc–Qs, and outputs the result to the drive 8 through an amplification circuit 40.

The drive 8 so operates the control valve CV as to bring the difference signal Qy to zero so that the flow rate on the downstream side of the orifice is equal to the set flow rate.

This pressure-type flow control system FCS is so designed that the flow rate on the secondary side of the orifice 2 is controlled through adjustment of the pressure P1 on the upstream side thereof. That permits control of the flow rate on the downstream side of the orifice 2 without being influenced by the gas pressure on the upstream side of the control valve CV and gives flow rate characteristics with a relatively high linearity.

For different types of gases or flow rates, the so-called flow factors against the standard gases and standard flow rates are prepared and stored. With that, the pressure-type flow control system FCS can also exercise flow rate control on different types of gases or flow rates with relative ease and high accuracy.

EXAMPLE 4

Figure 5:
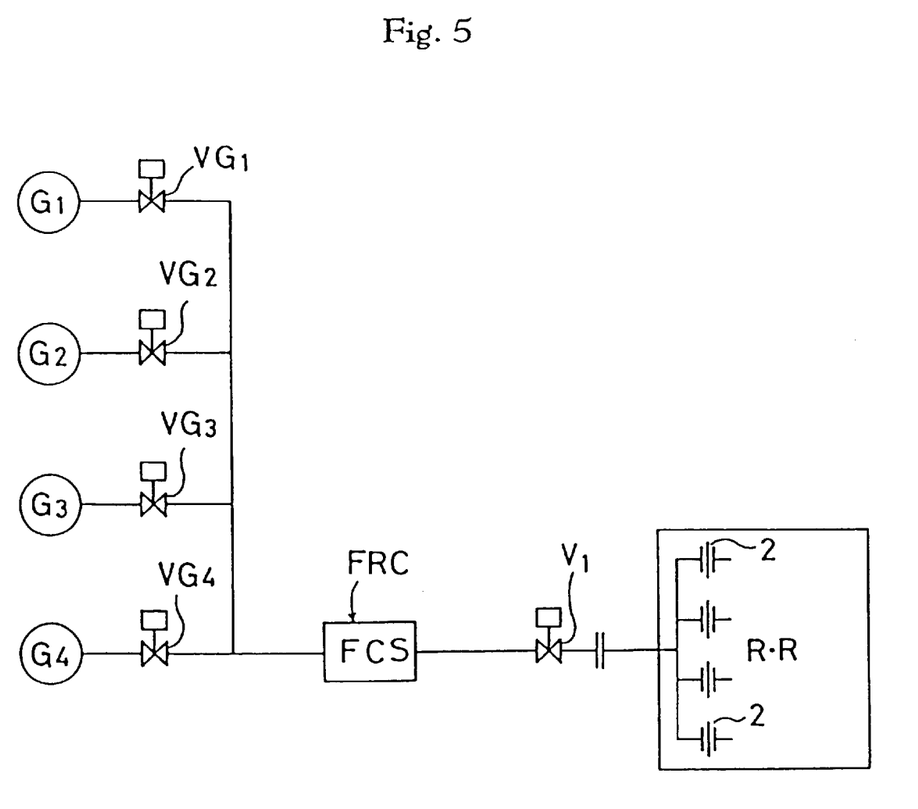
FIG. 5 is a schematic flow diagram of the basic configuration of an apparatus for feeding gases of a fourth embodiment of the present invention in which a pressure-type flow control system is used.

FIG. 5 shows a fourth embodiment of the present invention. In this embodiment, a pressure-type flow control system FCS is used as flow rate controller FRC and it is so configured that the orifice 2, an component of the pressure-type flow control system, is provided at the inlet of or inside of the treatment reactor RR on the downstream side of the gas feed valve V1.

One orifice 2 or more may be provided at the inlet of or inside of the treatment reactor RR, but two or more orifices would be convenient, for that would permit adjustment to any flow rate of the flow of gas to be discharged into the respective regions within the treatment reactor RR.

Two or more orifice, each with a different bore, would make it possible to control different flow rates of gas with one pressure-type flow control system FCS.

Figure 6:
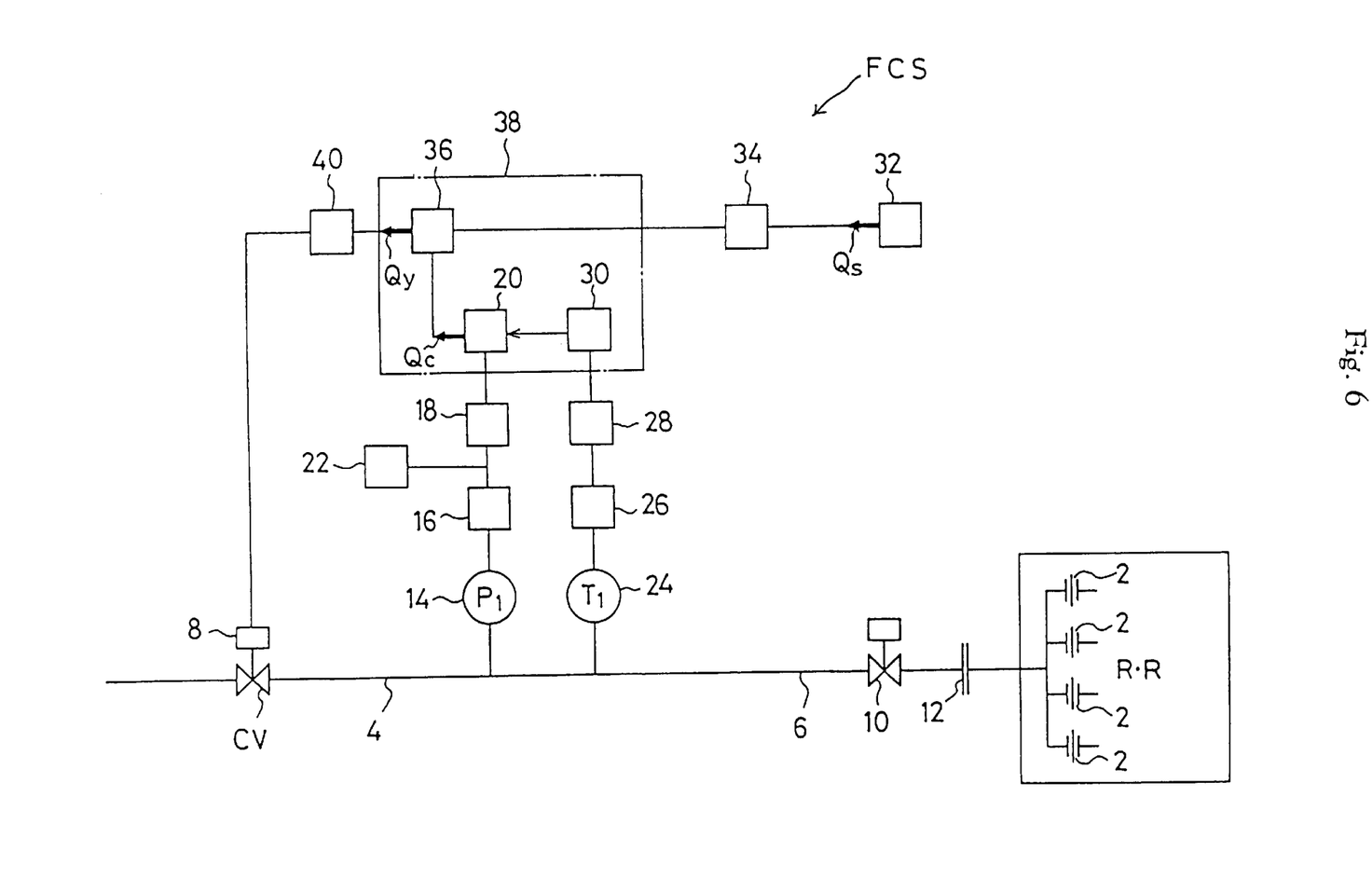
FIG. 6 is a schematic flow diagram of the basic configuration of a pressure-type flow control system in another embodiment of the present invention.

FIG. 6 is a schematic flow diagram of the configuration of the pressure-type flow control system FCS used in the fourth embodiment of the present invention shown in FIG. 5. It is different from the one in FIG. 4 in that the orifice 2 in FIG. 6 is provided at the inlet of or inside of the treatment reactor RR on the downstream side of the orifice-responding valve 10. In other points, the controller FCS in FIG. 6 is identical with that in FIG. 4. In case the cross-sectional area of the treatment reactor is so large as to require facilitation of the distribution of the flow rate of the discharge gas, the pressure-type flow control system FCS configured as FIGS. 4 and 6 is used as mentioned.

EXAMPLE 5

Figure 7:
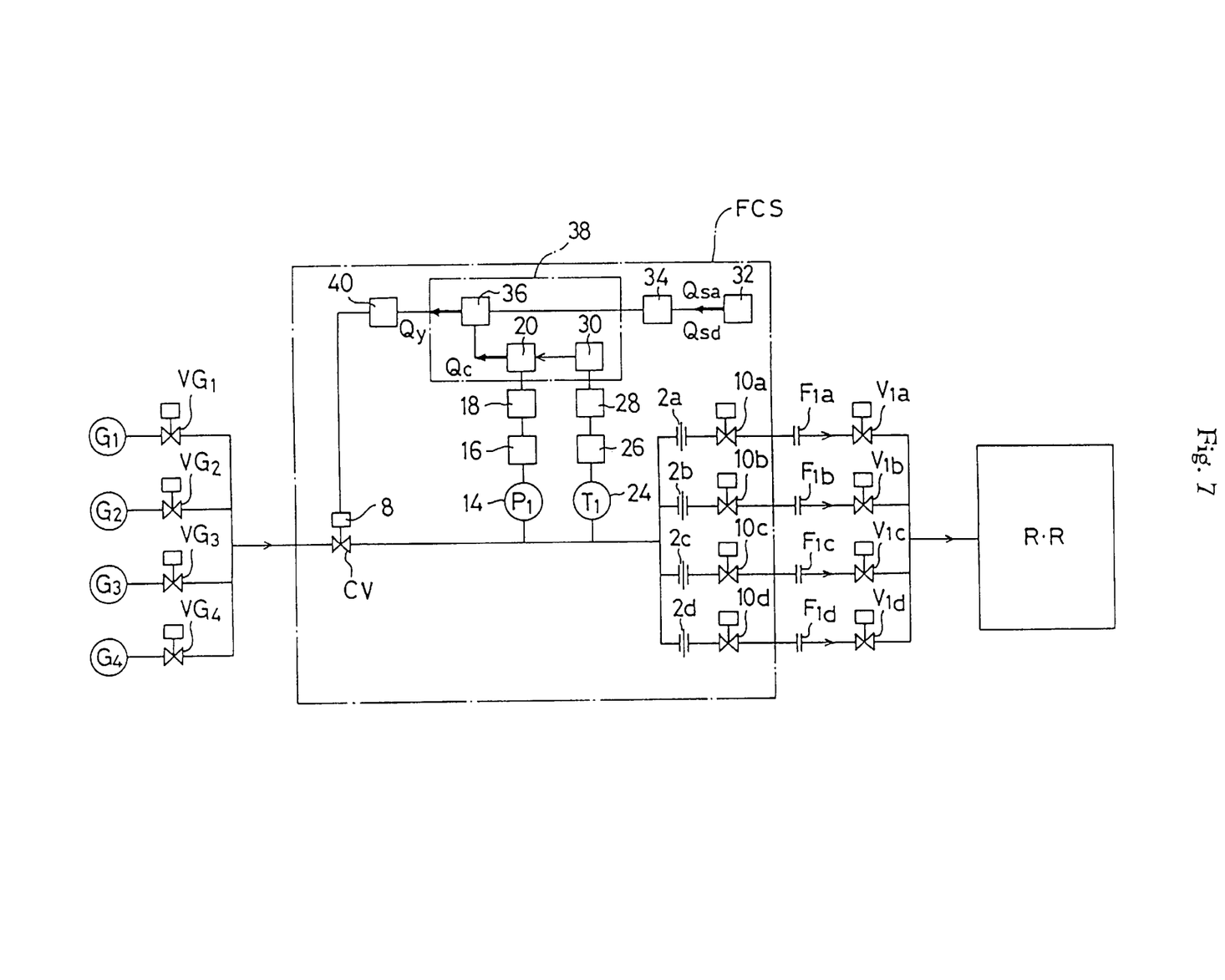
FIG. 7 is a schematic flow diagram of the configuration of an apparatus for feeding gases for use in semiconductor manufacturing of a fifth embodiment of the present invention.

FIG. 7 shows a fifth embodiment of the present invention. In this embodiment, a pressure-type flow control system FCS is used as flow rate controller FRC and it is so configured that the gas type is switched among G1, G2, G3, and G4 to supply each gas at a different flow rate to the treatment reactor RR.

In FIG. 7, the same component parts as those in FIGS. 3 and 4 are indicated by the common reference numbers.

That is, $2a$, $2b$, $2c$, and $2d$ in FIG. 7 are orifices. Those four orifices are different in bore and ranked in that order with $2a$ being the largest and $2d$ the smallest. $10a$, $10b$, $10c$, and $10d$ are orifice-responding valves. F1$a$, F1$b$, F1$c$, and F1$d$ are gas take-off ports. V1$a$ to V1$d$ are gas feed valves. While it is so configured in FIG. 7 that orifices $2a$, $2b$, $2c$, and $2d$ are different from each other in bore, two or more of them, needless to say, may be identical in bore.

In case a gas, nitrogen for example, is to be supplied from a gas source array consisting of G1, G2, G3, and G4 to the treatment reactor RR at a high flow rate, the gas flow rate is controlled this way: the orifice-responding valve $10a$ and the gas feed valve V1$a$ are opened while the orifice-responding values $10b$, $10c$, and $10d$ and the gas feed valves V1$b$, V1$c$, and V1$d$ are closed to actuate the orifice $2a$ so as to bring the flow rate of the gas supply to the set flow rate Qsa (maximum flow rate).

Similarly, when a gas, say, 02 is supplied from the gas source array consisting of G1, G2, G3, and G4 to the treatment reactor RR for the minimum flow rate of a gas at the minimum flow rate, the orifice-responding valve $10d$ and the gas feed valve V1$d$ are opened while the orifice-responding values $10a$, $10b$, and $10c$ and the gas feed valves V1$a$, V1$b$, and V1$c$ are closed to actuate the orifice $2d$ so as to bring the flow rate of the gas supply from the 02 source G4 to the set flow rate Qsd (minimum flow rate).

The set flow rates Qsa, Qsb, Qsc, and Qsd for the gases from G1 to G4 are freely set according to the needs at the treatment reactor RR. The full scale on the pressure-type flow control system FCS is switched as by properly adjusting the amplification degree of the output amplifier 16 for the pressure detector 14, for example, according to the sizes of the set flow rate Qsa to Qsd.

EXAMPLE 6

Figure 8:
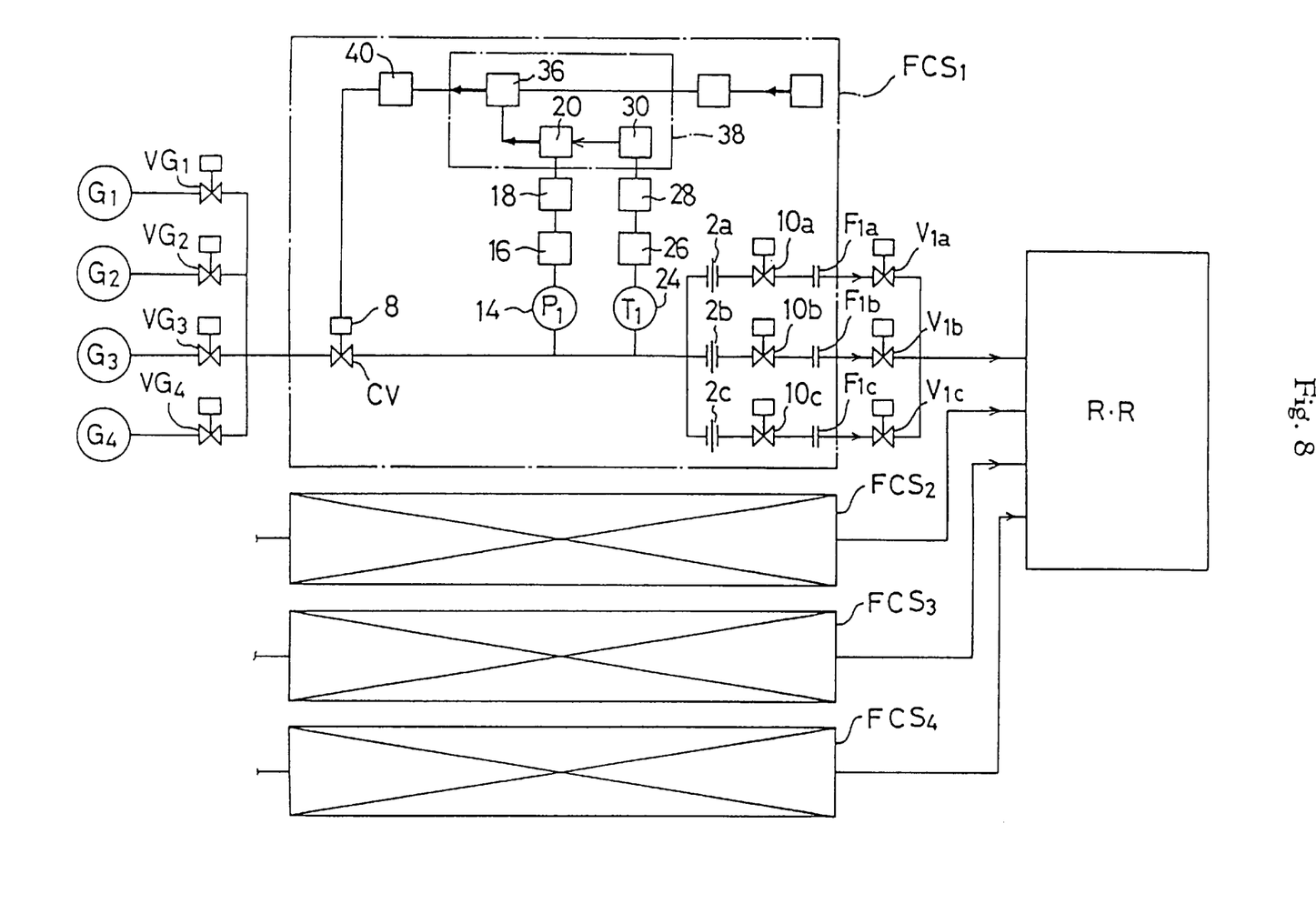
FIG. 8 is a schematic flow diagram of the configuration of an apparatus for feeding gases for use in semiconductor manufacturing of a sixth embodiment of the present invention.

FIG. 8 shows a sixth embodiment of the present invention. This embodiment is provided with four groups of gas sources, each group consisting of four different type gas sources, for example, G1 for hydrogen, G2 for oxygen, G3 for nitrogen and G4 for $SiH_4$ and is so configured that those gases are supplied to the treatment reactor RR at different flow rates.

That is, in FIG. 8, four units of the gas feeder shown in FIG. 6 which is provided with four different gas sources G1, G2, G3, and G4 are arranged in parallel and are each equipped with three orifices $2a$, $2b$, and $2c$, each with a different bore, for setting the flow rates.

As in FIG. 1, any two of the orifices $2a$, $2b$ and $2c$ can be identical in bore.

In the embodiment shown in FIG. 8, furthermore, it is possible to supply to the treatment reactor RR different gases from the different gas sources G1, G2, G3, and G4 simultaneously by actuating all the pressure-type flow control systems FCS1, FCS2, FCS3, and FCS4 or in a series fashion by repeating selection and actuation of one or more from those flow control systems. Needless to say, the respective pressure-type flow control systems FCS1, FCS2, FCS3, and FCS4 select the orifice $2a$, $2b$, or $2c$ having the bore which matches for the gas flow rate required.

The full scale on the pressure-type flow control systems FCS1, FCS2, FCS3 and FCS4 can be freely switched according to the selected orifice bore, that is, the gas flow rate just the same way as in FIG. 3 and FIG. 7.

EXAMPLE 7

Figure 9:
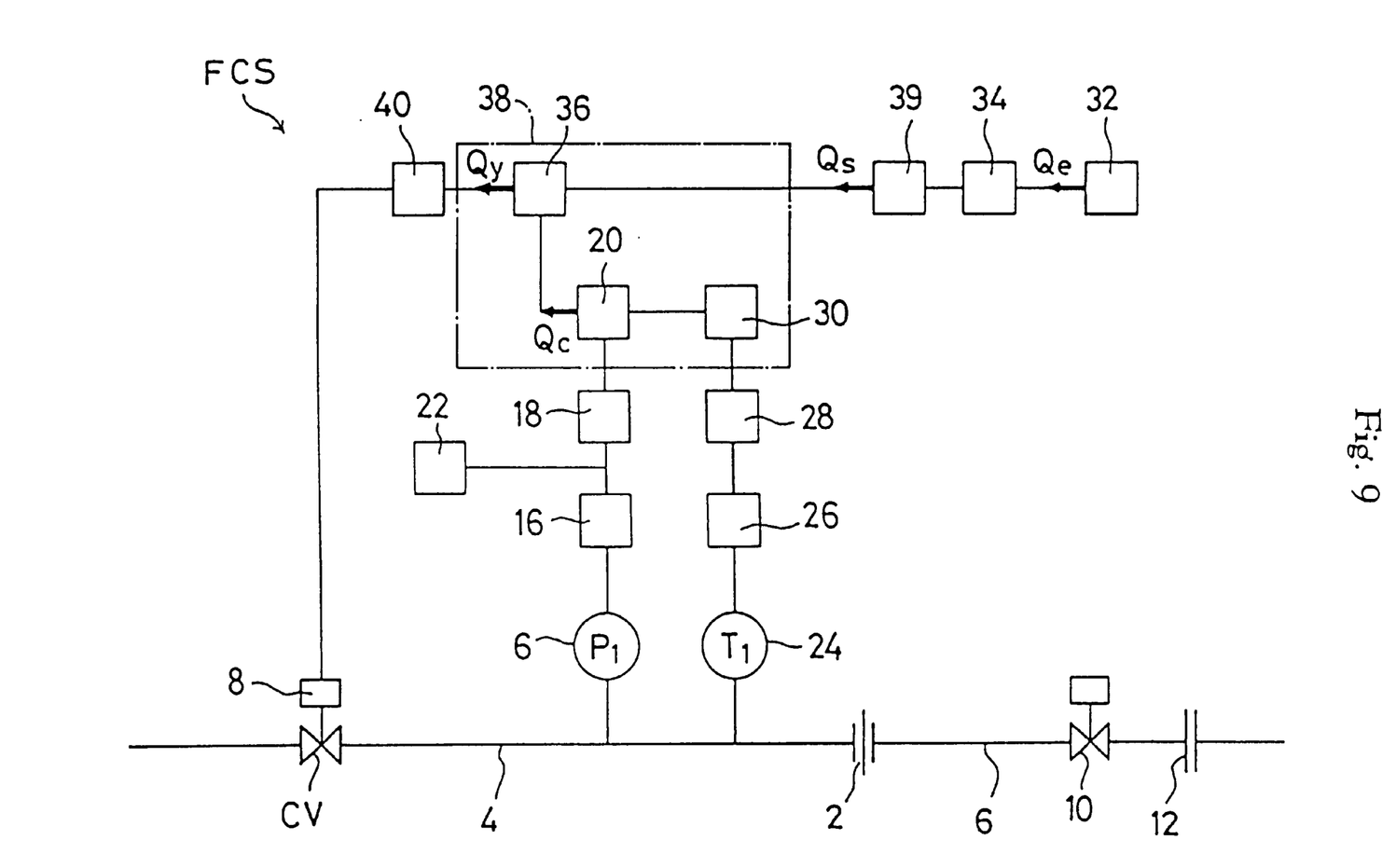
FIG. 9 is a schematic flow diagram of the basic configuration of the pressure-type flow control system used in an another embodiment of the present invention.

FIG. 9 shows a further embodiment of the pressure-type flow control system used in the present invention. This embodiment is the same as the pressure-type flow control system shown in FIG. 4 except that a flow rate conversion circuit 39 is provided between the flow rate-setting circuit 32 and the comparison circuit 36.

The flow rate conversion circuit 39 is to make the full scale flow rate variable.

In case the conversion rate k of the flow rate conversion circuit 39 is 1, that is, the full scale flow rate is not switched yet, the calculation circuit 20 calculates the flow rate Q from the pressure signal P1 by the equation Q=KP1. At the same time the flow rate Q is temperature-compensated by a compensation signal from the temperature compensation circuit 30, and the calculated flow rate Qc is output to the comparison circuit 36.

In case the conversion rate K in the flow rate conversion circuit 39 is set at the constant K, the signal Qe is converted into the flow rate specifying signal Qs (Qs=kQe) through the flow rate conversion circuit 39, and this flow rate specifying signal Qs is inputted in the calculation control circuit 38.

The constant K represents the flow rate conversion rate and is provided to make the full scale flow rate variable. Therefore, the flow rate conversion circuit 39 can vary the flow rate conversion rate k continuously or in stages. For the variation in stages, a dip switch, for example, can be used.

The flow rate conversion rate k set by the flow rate conversion circuit 39 for nitrogen gas, helium gas, $CF_4$ gas, etc. is varied in stages and is related to the flow factor FF of each gas which will be described later.

That is, the flow factor FF indicates how many times the flow rate of nitrogen gas the flow rate of such working gases as helium and $CF_4$ represents with the same bore of the orifice 2 and the same pressure P1 on the upstream side. It can be defined as FF=flow rate of working gas/that of nitrogen.

To be concrete, here are some examples of the factor FF: $N_2$=1, Ar=0.887, He=2.804, $CF_4$=0.556, $C_4F_8$=0.344.

If the orifice 2 in the pressure-type flow control system of the present invention is 90 microns, for example, and the control pressure, that is, P1 is 1.8 (kgf/cm2abs), the flow rate of nitrogen gas is 125.9 SCCM according to the results of experiments. This means that with the nitrogen gas, the full scale flow rate is 125.9 SCCM. This is set as 100% of the flow rate setting signal Qe with the voltage at 5 V. Since the flow rate conversion rate k is set at 1 (k=1) for nitrogen gas, the flow rate specifying signal Qs is 100% with the full scale at 125.9 SCCM, because Qs=kQe.

Now, there will be considered the switching of supply gases from nitrogen gas to helium gas with that orifice 2 and under the pressure P1. Suppose that the flow rate of helium gas to supply is 300 SCCM, for example, the flow factor FF of helium is 300 SCCM/2.804=107.0 SCCM.

Meantime, since 125.9 of SCCM of nitrogen gas is the full scale range in the present embodiment as mentioned earlier, the flow rate conversion rate K for helium is set as follows: 107.0 SCCM/125.9 SCCM=0.850.

As a result, the flow rate specifying signal Qs is Qs=0.850×Qe=0.850×300 SCCM, and the voltage is 5 B×0.850.

In the embodiment shown in FIG. 9, the flow factor FF of each supply gas against the reference gas nitrogen is worked out and stored, on the basis of which the flow rate conversion rate k is calculated for the type and the flow rate of the supply gas to be switched over to as mentioned. Setting the flow rate conversion rate in the flow rate conversion circuit at the calculated value K makes it possible to regulate the flow rate of the gas to be switched over to at the set flow rate Qe to continue the flow of gas.

In the embodiments shown in FIGS. 1 to 9, the mass flow controller MFC or the pressure-type flow control system FCS is used as flow rate controller FRC. The flow rate controller FRC is not limited to those two types but may be of any configuration such as, for example, the general-use flow rate controller made up of a combination of valves, orifices and detection sensors to detect the difference between the pressures before and after the orifice.

Also, the embodiments shown in FIGS. 4 to 9 are provided with orifice-responding valves 10a to 10d and gas feed valves V1a to V1c. But the orifice-responding valves 10a to 10d may be omitted, and the orifices 2a to 2d, a pressure detector P or the like may be properly incorporated in the valve bodies of the gas feed valves V1a to V1d.

EFFECT OF THE INVENTION

The apparatuses or a method for feeding gases for use at semiconductor manufacturing facilities as disclosed and claimed herein are configured so that a plurality of types of gases are grouped and the gases within the group are supplied through a flow rate controller one after another to a semiconductor treatment reactor, or so that one type of gas is controlled by a flow rate controller and supplied through different flow paths either simultaneously or in a series fashion. This is to be compared with prior art gas feeders provided with a flow rate controller on every gas line to the semiconductor manufacturing facility. Thus, the present invention permits size reduction and cost reduction of the gas feeder and besides substantially cuts down the maintenance costs of the equipment.

The present invention can cope with a change of gas types and major change in gas flow rate with one and the same flow rate controller with relative ease and thus allow continuation of flow rate control with high accuracy. Likewise, the present invention can respond to not only a change of gas types but also to a major change in gas flow rate very easily, and can maintain high accuracy flow rate control even when there is a change of gas types and gas flow rates.

This invention additionally permits free adjustment of the distribution of the gas discharge flow rate within the treatment reactor, and thus enables processing steps to proceed in a semiconductor manufacturing facility with high accuracy.

What is claimed is:

1. A method for feeding gases to semiconductor manufacturing facilities, comprising the steps of:
    providing a single flow rate controller unit for gas supply for a plurality of semiconductor manufacturing processes or steps;
    serially supplying one or more types of gases to said manufacturing processes or steps by switching at specific time intervals to each process or step; and
    regulating the flow rate by said single flow rate controller.

2. A method for feeding gases to semiconductor manufacturing facilities as defined in claim 1, further comprising the step of simultaneously supplying one or more types of gases to a treatment reactor unit from a plurality of feed ports.

3. A method for feeding gases to semiconductor manufacturing facilities as defined in claim 1, and further comprising the steps of:
    determining data comprising flow rate control characteristics for each type of gas to be supplied and flow rate for each manufacturing process or step;
    storing said data in a storage means; and
    retrieving said data from said storage means at the time of said switching; and
    wherein said step of regulating comprises regulating the flow rate with said flow rate controller based on said data.

4. A method for feeding gases to semiconductor manufacturing facilities as defined in claim 1, wherein the flow rate controller is a pressure-type flow controller, and further comprising the following steps:
    determining a flow factor against a reference gas for each of the types of gases to be supplied;
    storing said data; and
    when the type of gas is changed, adjusting a flow rate specifying signal Qs for the gas to be switched over to kQe, wherein Qs=kQe, wherein Qe is a set flow rate signal against the reference gas and k is a flow rate conversion rate.

5. A method for feeding gases to semiconductor manufacturing facilities as defined in claim 1, wherein the flow rate controller is a pressure-type flow control system having a plurality of orifices with different bores in parallel; and further comprising the step:
    selectively actuating said orifices according to a flow rate of the gas to be supplied and to which the system is switched over.

6. A method for feeding gases to semiconductor manufacturing facilities as defined in claim 2, and further comprising the steps of:
    determining data comprising flow rate control characteristics for each type of gas to be supplied and flow rate for each manufacturing process or step;
    storing said data in a storage means;
    retrieving said data from said storage means at the time of said switching; and
    regulating the flow rate with said flow rate controller based on said data.

7. A method for feeding gases to semiconductor manufacturing facilities as defined in claim 2, wherein the flow rate controller is a pressure-type flow controller, and further comprising the following steps:

determining a flow factor against a reference gas for each of the types of gases to be supplied;

storing said data; and when the type of gas is changed, adjusting a flow rate specifying signal Qs for the gas to be switched over to kQe, wherein Qs=kQe, wherein Qe is a set flow rate signal against the reference gas and k is a flow rate conversion rate.

8. A method for feeding gases to semiconductor manufacturing facilities as defined in claim 2, wherein the flow rate controller is a pressure-type flow control system having a plurlaity of orifices with different bores in paralle; and further comprising the step:

selectively actuating said orifices according to a flow rate of the gas to be supplied and to which the system is switched over.

* * * * *